United States Patent
Liu et al.

(10) Patent No.: US 9,230,781 B2
(45) Date of Patent: Jan. 5, 2016

(54) CAPACITIVE-COUPLED PLASMA PROCESSING APPARATUS AND METHOD FOR PROCESSING SUBSTRATE

(75) Inventors: Zhongdu Liu, Shanghai (CN); Gerald Zheyao Yin, Shanghai (CN)

(73) Assignee: ADVANCED MICRO-FABRICATION EQUIPMENT INC, SHANGHAI, Shanghai (CN)

( * ) Notice: Subject to any disclaimer, the term of this patent is extended or adjusted under 35 U.S.C. 154(b) by 195 days.

(21) Appl. No.: 13/564,427

(22) Filed: Aug. 1, 2012

(65) Prior Publication Data

US 2013/0032574 A1 Feb. 7, 2013

(30) Foreign Application Priority Data

Aug. 2, 2011 (CN) .......................... 2011 1 0219413

(51) Int. Cl.
*H01J 37/32* (2006.01)
*H05H 1/46* (2006.01)

(52) U.S. Cl.
CPC ..... *H01J 37/32669* (2013.01); *H01J 37/32091* (2013.01); *H05H 1/46* (2013.01); *H05H 2001/4675* (2013.01)

(58) Field of Classification Search
CPC .................................................. H01J 37/32669
USPC ................ 156/345.43–345.47; 118/715, 722, 118/723 R, 723 E
See application file for complete search history.

(56) References Cited

U.S. PATENT DOCUMENTS

| | | | | |
|---|---|---|---|---|
| 4,264,767 A | * | 4/1981 | Quinlan | 544/57 |
| 5,718,795 A | * | 2/1998 | Plavidal et al. | 156/345.46 |
| 5,731,565 A | * | 3/1998 | Gates | 219/121.54 |
| 6,074,518 A | * | 6/2000 | Imafuku et al. | 156/345.46 |
| 6,377,149 B1 | * | 4/2002 | Miyata | 335/306 |
| 6,568,346 B2 | * | 5/2003 | Pu et al. | 118/723 I |
| 2001/0004920 A1 | * | 6/2001 | Loewenhardt et al. | 156/345 |
| 2005/0006028 A1 | * | 1/2005 | Keil et al. | 156/345.46 |
| 2005/0263070 A1 | * | 12/2005 | Fink | 118/715 |
| 2008/0078957 A1 | * | 4/2008 | Graf et al. | 250/492.21 |

FOREIGN PATENT DOCUMENTS

JP 2000036486 A * 2/2000

OTHER PUBLICATIONS

English Machine Translation of JP 2000-036486 A. Obtained from http://www19.ipdl.inpit.go.jp/PA1/cgi-bin/PA1DETAIL on May 30, 2014.*

* cited by examiner

*Primary Examiner* — Maureen Passey
(74) *Attorney, Agent, or Firm* — Vierra Magen Marcus LLP

(57) ABSTRACT

The present invention relates to a capacitive-coupled plasma processing apparatus, wherein an electric field regulating element, i.e., an "electric field lens", is arranged in the reaction chamber to generate a regenerated electric field in a direction opposite to that of the original radio frequency electric field in the reaction chamber, so that the non-uniformity of etching rate on the surface of the substrate of the plasma incurred by the original radio frequency electric field is decreased; and the electric field regulating element, i.e., the "electric field lens", further decreases the equivalent quality factor Q value of the reaction chamber, expands the radio frequency band, and prevents high-voltage electric arcing. The present invention further provides a method for processing the substrate using the processing apparatus.

19 Claims, 4 Drawing Sheets

CAPACITIVE-COUPLED PLASMA PROCESSING APPARATUS AND METHOD FOR PROCESSING SUBSTRATE

This application claims the priority of Chinese Patent Application No. 201110219413.5, entitled "CAPACITIVE-COUPLED PLASMA PROCESSING APPARATUS AND METHOD FOR PROCESSING SUBSTRATE", filed on Aug. 2, 2011 with State Intellectual Property Office of PRC, which is hereby incorporated by reference in its entirety.

FIELD OF THE INVENTION

The present invention relates to plasma processing apparatus and method for processing substrate, and in particular to a capacitive-coupled plasma processing apparatus enabling uniform distribution of plasma and a method for processing substrate by using the same.

BACKGROUND OF THE INVENTION

At present, in fabricating a semiconductor device, a capacitive-coupled plasma processing apparatus is often adopted to generate plasma of reaction gas for performing processes such as etching and depositing on the substrate.

FIG. 1 shows an existing capacitive-coupled plasma generator, in which at least one pair of planar electrodes, i.e., a first electrode 210 and a second electrode 220, is arranged in parallel in a vacuum reaction chamber 100 of the plasma generator, and a substrate 300 to be etched is placed on a supporting holder 120 where the second electrode 220 is provided; optionally, radio frequency power is applied on the second electrode 220 and the first electrode 210 is grounded to generate a radio frequency electric field for ionizing the reaction gas that is introduced into the reaction chamber 100 and generating plasma to be used for etching.

However, the uniformity of the electric field distribution in the reaction chamber of the prior art is far from ideal. The difference in the actual structures of the two electrodes and the grounded sidewall will lead to bend of the electric field lines, causing the whole radio frequency electric field in the reaction chamber 100 to be non-uniform.

As shown in FIG. 1, the electric field lines 230b located at the middle positions above the second electrode 220 are distributed uniformly; however, the closer to the side positions above the second electrode 220, the radio frequency electric field lines 230a are bent, and the greater the deflection angle of the electrode field lines 230a are and the more sparsely the electrode field lines 230a are distributed. Referring to the dashed lines in FIG. 1, they indicate the density distribution of the plasma at different positions above the second electrode 220. It can be seen that the density of the plasma of the reaction gas generated at the side position of the second electrode 220 is less than that at the middle position of the second electrode 220; and because the speed of etching or other processes on the substrate 300 is in positive relation to the density of the plasma, the non-uniformity of the etching or other processes on the substrate 300 would happen finally. For example, the etching or the other processes are done quickly in the center portion of the substrate 300 while slowly at the edge portion of the substrate 300. This has great influence on both the process control and the final quality of semiconductor device fabrication.

SUMMARY OF THE INVENTION

The object of the present invention is to provide an improved capacitive-coupled plasma processing apparatus. By providing an electric field regulating element made of magnetic conductive material such as ferrite ring at the periphery of the substrate, which electric field regulating element acts as an "electric field lens" arranged for the electric field in the reaction chamber, the strength and distribution of the electric field are re-regulated, since a regenerated electric field in a direction opposite to that of the original radio frequency electric field (or having a significant phase shift) is induced in the reaction chamber for counteracting or compensating the influence of the non-uniform distribution of the original radio frequency electric field at different positions of the substrate.

Another object of the present invention is to provide a method for processing the substrate in the capacitive-coupled plasma processing apparatus, so as to obtain better processing uniformity at different positions of the substrate being processed (such as the central region and the side region of the substrate).

To achieve the above objects, the present invention provides a capacitive-coupled plasma processing apparatus, which includes:

a reaction chamber into which reaction gas is introduced, where a supporting holder for placing a substrate to be processed, a first electrode and a second electrode are arranged in the reaction chamber, the first electrode and the second electrode are arranged in parallel, the first electrode is arranged in a top portion of the reaction chamber, the second electrode is arranged inside the supporting holder, at least one radio frequency power source is connected to the first electrode or the second electrode to form a radio frequency electric field in the reaction chamber for generating plasma of the reaction gas; and at least one electric field regulating element, i.e., "electric field lens", made of magnetic conductive material, which is arranged nearby the substrate and has a hollow region in its central portion, where the radio frequency electric field at least partially passes through the hollow region of the electric field regulating element so as to induce a regenerated electric field in a direction opposite to that of the radio frequency electric field, and in the reaction chamber the regenerated electric field and the radio frequency electric field are superposed to form a resultant electric field for adjusting the plasma density at different positions on the surface of the substrate.

Preferably, the magnetic conductive electric field regulating element is a closed ferrite ring.

In an embodiment, the magnetic conductive electric field regulating element is located in the reaction chamber and is arranged on the bottom of the sidewall outside the supporting holder.

In another embodiment, the magnetic conductive electric field regulating element is arranged inside the sidewall of the reaction chamber.

Preferably, the magnetic conductive electric field regulating element is arranged concentrically with the substrate; and the plasma density distribution at the center and edge portions of the substrate is adjusted by the resultant electric field of the regenerated electric field and the radio frequency electric field.

In yet another preferred embodiment, the plasma processing apparatus further includes an induction coil through which the electric field regulating element is arranged; the induction coil is further connected to a radio frequency source; and the strength of the regenerated electric field is adjusted by changing the parameters (for example power or frequency) of the radio frequency source.

In a further preferred embodiment, the electric field strength of the regenerated electric field is adjusted by the reluctance of the electric field regulating element.

The magnetic conductive electric field regulating element includes: a reluctance regulator with a position regulating means; and a main body; the main body cooperates with at least a part of the reluctance regulator to form a closed circuit of the electric field regulating element.

Under the driving of the position regulating means, the reluctance regulator moves relative to the main body, and a corresponding gap is left on the electric field regulating element.

The reluctance in the gap is different from that in the main body and the reluctance regulator; and the reluctance of the magnetic conductive electric field regulating element is controlled by the reluctance in the corresponding portion of the closed circuit formed by the reluctance regulator and the main body.

The reluctance regulator moves along the axial direction of the electric field regulating element, or moves towards or away form the center of the electric field regulating element along the radial direction of the electric field regulating element, to regulate the size of the gap and thus regulate the reluctance of the magnetic conductive electric field regulating element.

Compared with the prior art, the plasma processing apparatus of the present invention has the following advantages: by providing an electric field regulating element made of magnetic conductive material such as ferrite ring at the periphery of the substrate, a regenerated electric field in a direction opposite to that the original radio frequency electric field is induced in the reaction chamber, which decreases the influence of the non-uniform distribution of the original radio frequency electric field in respective regions on the upper surface of the substrate. In the present invention, under the action of the resultant electric field of the radio frequency electric field and the regenerated electric field, the plasma density on the upper surface of the substrate is distributed uniformly, so that the speed of etching the substrate by the plasma is rendered uniform.

According to another aspect of the present invention, the present invention provides a method for processing the substrate in the capacitive-coupled plasma processing apparatus, where the plasma processing apparatus includes a reaction chamber into which reaction gas is introduced, a supporting holder for placing the substrate, a first electrode and a second electrode are arranged in the reaction chamber, the first electrode and the second electrode are arranged in parallel, the first electrode is arranged in a top portion of the reaction chamber, the second electrode is arranged inside the supporting holder, and the method includes:

applying at least one radio frequency power supply to the first electrode and the second electrode, for forming a radio frequency electric field in the reaction chamber;

regulating the radio frequency electric field by at least one electric field regulating element made of magnetic conductive material which is placed nearby the substrate and has a hollow region, where the radio frequency electric field at least partially passes through the hollow region of the electric field regulating element so as to induce a regenerated electric field in a direction opposite to that of the radio frequency electric field and forms an electric field lens, the regenerated electric field and the radio frequency electric field of the electric field lens are superposed to form a resultant electric field, and the reaction gas is turned into optimized plasma under the action of the resultant electric field; and processing the substrate using the plasma.

Preferably, an induction coil with radio frequency source can be arranged on the electric field regulating element, so as to adjust the electric field strength of the regenerated electric field by adjusting the frequency or the power of the radio frequency source; alternatively, a reluctance regulator with a position regulating means can be further arranged on the electric field regulating element, for moving the reluctance regulator along the axial direction or the radial direction to form a corresponding gap on the electric field regulating element, thereby adjusting the reluctance of the whole magnetic conductive closed loop, so as to adjust the electric field strength of the regenerated electric field. By adjusting the electric field strength of the regenerated electric field, the density distribution of the plasma in the reaction chamber can be further controlled, for example the original situation, in which the plasma density at the central portion of the substrate is higher than that at the edge portion of the substrate, is continuously adjusted to the situation in which the density at the central portion of the substrate and the density at the edge portion of the substrate are substantially uniform, and thus the etching processes performed on various portions of the substrate are more uniform; alternatively, the electric field strength can be further increased or the reluctance can be further decreased, so that the plasma density at the central portion of the substrate is lower than that at the edge portion of the substrate, so as to obtain different processing effects that the etching is slow at the central portion of the substrate and quick at the edge portion of the substrate.

As a variation of the above several embodiments, it is also possible that the center of the electric field regulating element is deviated from the center of the substrate, thereby obtaining the effect in which the plasma density at the center of the electric field regulating element is lower than that at the edge of the electric field regulating element, which can cooperate with the effect of controlling the plasma density of the radio frequency electric field to obtain different etching effects at different regions of the substrate.

DETAILED DESCRIPTION OF THE INVENTION

Several specific embodiments of the present invention will be described in conjunction with the drawings in the following.

The plasma processing apparatus provided in the embodiment will be described in the following. By providing an electric field regulating element made of magnetic conductive material such as ferrite ring at the periphery of the substrate, which acts as an "electric field lens" provided for the radio frequency electric field in the reaction chamber, the strength and distribution of the radio frequency electric field are re-regulated, since a regenerated electric field in a direction opposite to that of the original radio frequency field is induced in the reaction chamber for counteracting or compensating the influence of the non-uniform distribution of the original radio frequency electric field at different positions of the substrate.

Embodiment 1

Figure 1:
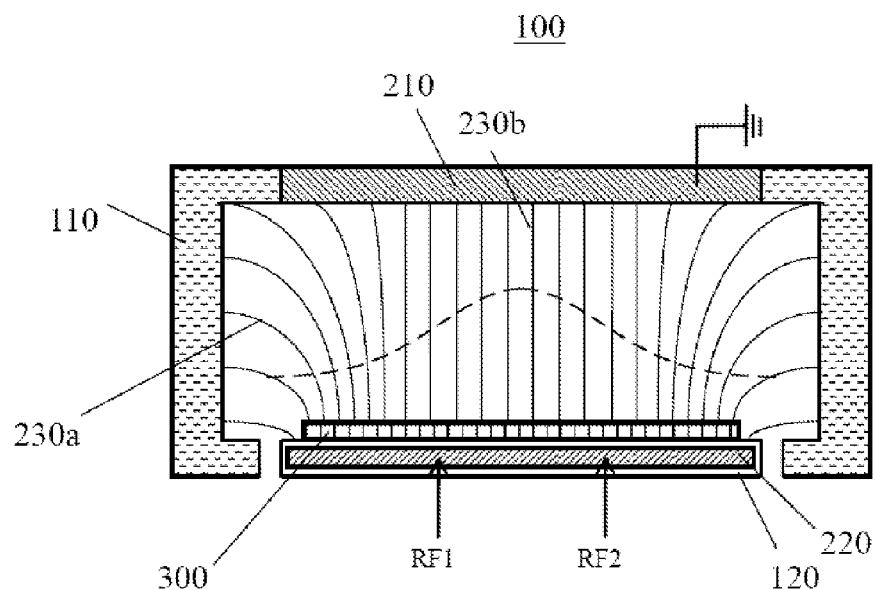
FIG. 1 is a schematic diagram showing a general structure of an existing capacitive-coupled plasma processing apparatus and the non-uniform distribution of the plasma density in the apparatus.
Figure 2A:
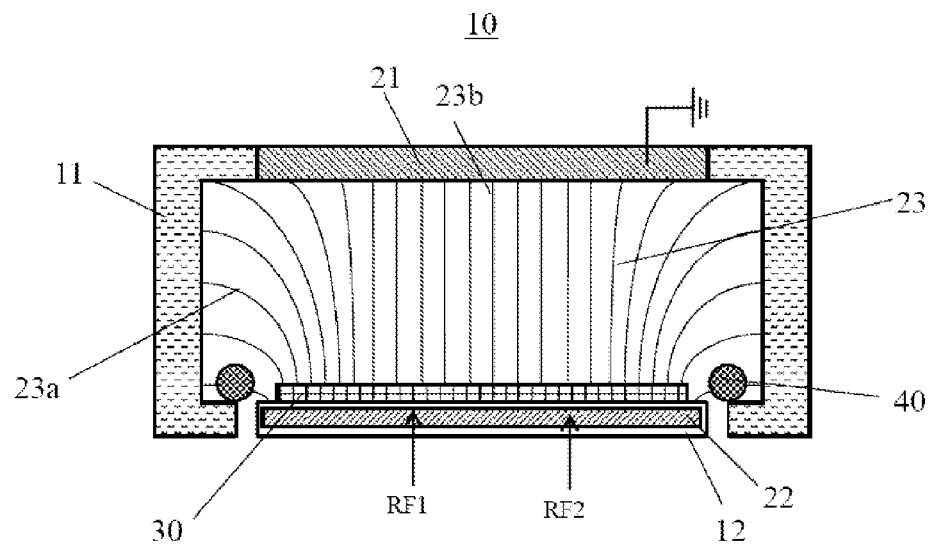
FIGS. 2a is a schematic general structural diagram of a plasma processing apparatus provided by the present invention.

FIG. 2a is a schematic general structural diagram of a plasma processing apparatus provided by the present invention. The plasma processing apparatus in the diagram is a capacitive-coupled processing apparatus. The capacitive-coupled processing apparatus includes a vacuum reaction chamber 10 into which reaction gas is introduced; a first electrode 21 of planar type is provided in the top portion of the reaction chamber 10, and the first electrode 21 is grounded via the sidewall 11 or is connected to one or more radio frequency power source (not shown); a supporting holder 12 for placing a substrate 30 is provided at the bottom of the reaction chamber 10; and a second electrode 22 of planar type in parallel with the first electrode 21 is provided inside the supporting holder 12. It should be understood that the supporting holder 12 is only exemplary, and the supporting holder 12 can include an electrostatic chuck plate (not shown) and a second electrode 22 under the electrostatic chuck plate.

The second electrode 22 can be selectively connected to a first radio frequency source RF1 (for example 60 MHz) and/or a second radio frequency source RF2 (for example about 2 MHz) that has different frequencies, so that at least one of the first radio frequency source and the second radio frequency source or the resultant radio frequency power source of the both is applied onto the second electrode 22, and the second electrode 22 acts together with the first electrode 21 to form an alternating radio frequency electric field 23 (23a, 23b) in the reaction chamber 10. Generally, the frequency of the second radio frequency source RF2 is lower than that of the first radio frequency source RF1, and the second radio frequency source RF2 usually serves as introducing bias voltage, so as to control the energy and the energy distribution of the ions of the plasma which are incident onto the substrate 30.

Figure 2B:
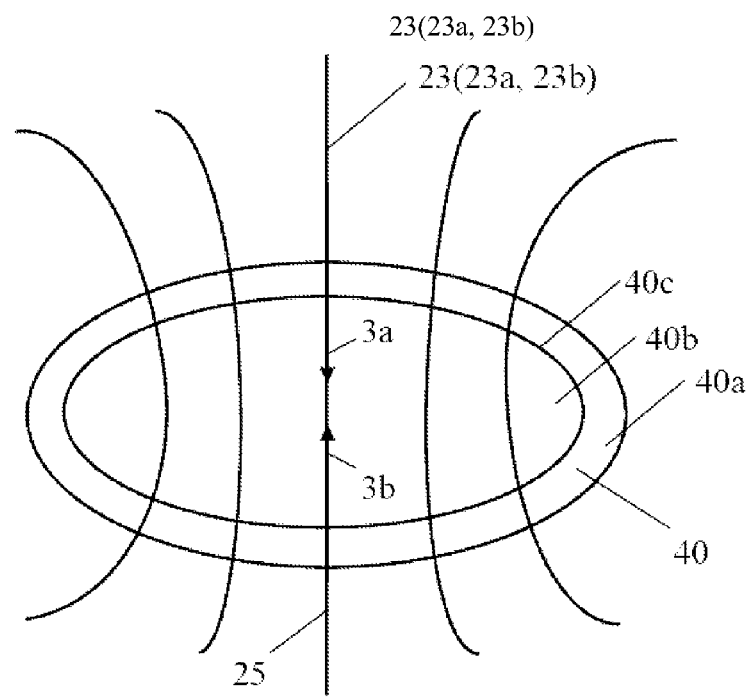
FIGS. 2b shows a schematic diagram of working principle of an electric field regulating element of the present invention.

In the present invention, in order to improve the plasma density distribution on regions above the upper surface of the substrate 30, one or more electric field regulating elements 40 made of magnetic conductive material are provided at a position nearby the substrate 30. Referring to FIG. 2b, FIG. 2b shows a schematic diagram of working principle of the electric field regulating element 40. In the shown embodiment, the electric field regulating element 40 is annular in shape, and is provided at a place in the bottom portion of the reaction chamber 10 which is located at the periphery of the supporting holder 12, so that the electric field regulating element 40 is concentric with the substrate 30 and is provided generally around the substrate 30. The electric field regulating element 40 includes a main body 40a, which is generally in a continuous structure and has a hollow region 40b in its central portion. In the reaction chamber 10, by appropriately placing the regulating element 40, the aforesaid alternating radio frequency electric field 23 (23a, 23b) is enabled to at least partially or entirely pass through the hollow region 40b of the electric field regulating element 40. Because the electric field regulating element 40 is made of magnetic conductive material, the alternating radio frequency electric field 23 will generate high-frequency alternating magnetometive force in the main body 40a of the electric field regulating element 40 according to the Faraday's Law, inducing an alternating magnetic field, and the alternating magnetic field in turn induces a regenerated electric field 25 in a direction opposite to that of the radio frequency electric field 23. As shown in FIG. 2b, at a certain instant, the radio frequency electric field 23 is in an electric field direction as shown in arrow 3a, and the regenerated electric field is in an electric field direction as shown in arrow 3b. The regenerated electric field 25 and the radio frequency electric field 23 are superposed in the reaction chamber 10 to form a resultant electric field (not numbered), so as to regulate or adjust the electric field distribution above the substrate 30 to a certain extent, so that the electric field distribution or the electric field strength in the edge region and the central region above the substrate 30 is substantially uniform. The electric field regulating element 40 of the present invention is equivalent to an "electric field lens" provided to the electric field in the reaction chamber 10, so that the electric field strength and distribution of the radio frequency electric field are re-regulated after the electric field passes through the "electric field lens". The reaction gas in the reaction chamber 10 will form the plasma under the action of the resultant electric field. Thus the plasma density of various regions (for example but not limited to the central region and the edge region) above the substrate 30 are adjusted to be generally equivalent. By processing the substrate 30 using the plasma, better processing uniformity, for example the uniformity of the etching rate, are obtained.

Specifically, as shown in FIG. 2a, for the radio frequency electric field formed between the first and the second electrodes 21 and 22, the electric field lines 23b at the central portion of the substrate 30 are distributed vertically and spaced uniformly, and the electric field lines 23a at the edge of the substrate 30 have a horizontal component and offset toward the sidewall 11 of the reaction chamber 10, where the closer to the edge of the substrate 30, the greater the angular deflection is and the more sparse the distribution becomes. The regenerated electric field induced by the electric field regulating element 40 is just in a direction opposite to that of the radio frequency electric fields 23a, 23b, so on the whole, the density and the strength of the electric field 23b at the central region above the substrate 30 is relatively reduced to be close to the density and the strength of the electric field 23a at the edge portion above the substrate 30. Thus, the resultant effect is that the influence of the non-uniform distribution of the radio frequency electric field in the prior art can be decreased.

Figure 3:
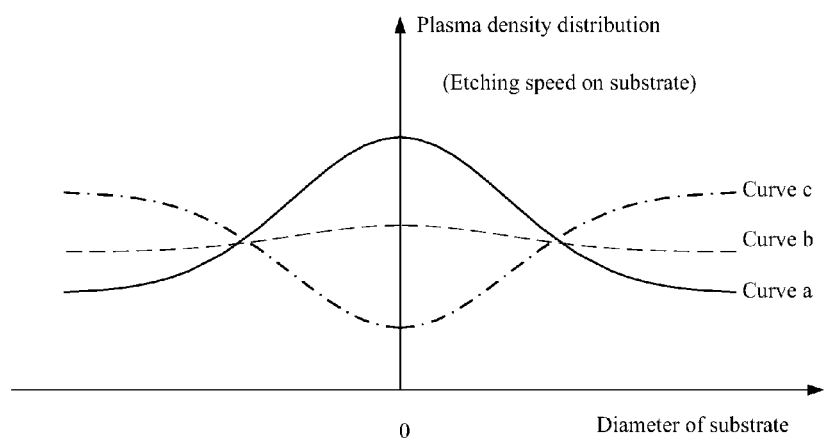
FIG. 3 is a schematic diagram showing the effect of the electric field regulating element in the plasma processing apparatus of the present invention in regulating the plasma density distribution.

As shown in FIG. 3, FIG. 3 is a schematic diagram showing the effect of an electric field regulating element in the plasma processing apparatus of the present invention in regulating the plasma density distribution. On the shown abscissa, the origin O represents the centre of the substrate 30, and the two sides of the origin O represents the radius extent of the substrate 30; the ordinate represents the plasma density distribution at different positions of the reaction chamber 10 in radial direction of the substrate 30; and because the speed of etching the substrate 30 or the speed of other plasma processing is positively relative to the density of plasma, the ordinate can also be used to represent the speed of etching at different positions in radial direction of the substrate 30 or the speed of other processing other plasma processing. The curve "a" represents the plasma density distribution in the prior art. It can be seen from the curve "a" that under the action of the non-uniformly distributed radio frequency electric field, the plasma density is the highest at the central portion of the substrate 30; and the closer to the edge portion of the substrate 30, the lower the plasma density becomes. The curve "c" represents the plasma density distribution that should occur under the action of the regenerated electric field. It can be seen from the curve "c" that the plasma density at the central portion of the substrate 30 is lower than that at the edge portion of the substrate 30 due to the regenerated electric field. However, because the electric field regulating element 40 has a certain amount of magnetic reluctance, corresponding loss is caused to the strength of the reverse regenerated electric field 25, thus the electric field strength of the reverse regenerated electric field 25 is lower than that of the radio frequency electric field 23. Therefore, as compared with the curve "a", for the plasma density distribution from the center to the edge, the plasma density distribution curve "c" generated by the regenerated electric field is in a direction opposite to that of the curve "a" and has a smaller value on the ordinate (i.e., smaller plasma density). Therefore, a relatively smooth plasma density distribution curve "b" can be obtained by superposing the curve "c" and the curve "a". That is to say, under the action of the resultant electric field of the regenerated electric field and the radio frequency electric field, relatively even plasma density distribution can be obtained in the reaction chamber 10 at different positions in radial direction of the substrate 30, so as to improve the uniformity of the plasma processing at the central portion and the edge portion of the substrate 30.

The electric field regulating element 40 is made of magnetic conductive material, and preferably be made of ferrite material. According to the specific design of the inner space of the reaction chamber 10, the periphery of the main body 40a of the electric field regulating element 40 can be of any shape, such as annular, square, and regular polygon. The electric field regulating element 40 further includes an inner surface 40c (FIG. 2b), and the inner region surrounded by the inner surface 40c constitutes the hollow region 40b, the shape of which can be designed to correspond or close to the shape of the substrate 30 to be processed. For example, if the substrate 30 to be processed is circular, then the hollow region 40b is also circular, and the diameter of the hollow region 40b can be designed as equal to, or larger or less than the diameter of the substrate 30 as required. Alternatively, if the substrate is a square LCD panel, then the hollow region 40 can be designed accordingly in shape.

Preferably, the main body 40a of the above electric field regulating element 40 is of a continuous structure, such as a closed or quasi closed ferrite ring, as long as high-frequency alternating magnetic flux can be generated in the main body 40a and then a regenerated electric field in a direction opposite to that of the radio frequency electric field in can be induced.

Embodiment 2

Figure 4:
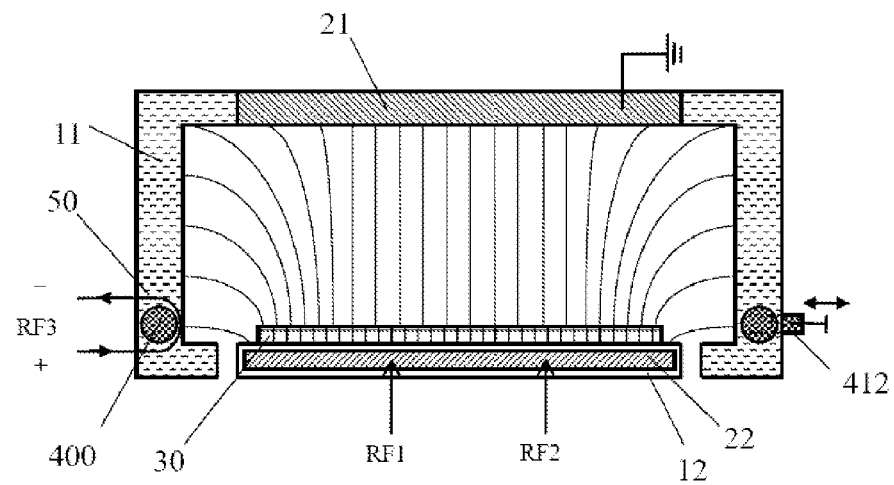
FIGS. 4 is a schematic general structural diagram of another plasma processing apparatus provided by the present invention.

As shown in FIG. 4, FIGS. 4 is a schematic diagram of another plasma processing apparatus provided by the present invention. Similar to the above embodiment, a second electrode is provided in parallel in the vacuum reaction chamber 102 in which the reaction gas is introduced, and a substrate 30 to be processed is placed on a supporting holder 12 including the second electrode 22. The first electrode 21 is grounded via the sidewall 11 of the reaction chamber 10 or is connected to a radio frequency power source, and at least one radio frequency power source is applied on the second electrode 22, therefore a radio frequency electric field is formed in the reaction chamber 10 to generate plasma of the reaction gas for performing processes such as etching the substrate 30.

The difference from the above embodiment is that the electric field regulating element 400 in the embodiment shown in FIG. 4 is provided nearby the substrate 30 and is provided inside the sidewall 11 of the reaction chamber 10, with the electric field regulating element 400 and the sidewall 11 being electrical isolated. It should be understood that the electric field regulating element 400 can also be partially provided inside the sidewall 11 of the reaction 10, with the electric field regulating element 400 and the sidewall 11 being electrical isolated. This configuration can eliminate the gas resistance influence of the electric field regulating element 400 made on the reaction gas in the reaction chamber 10, and prevent the electric field regulating element 400 from being wear down by the erosion of plasma or prevent the undesired reaction impurity from being generated.

Similar to the principle in the above embodiment, the radio frequency electric field passes through the hollow region 40b of the electric field regulating element 400, and induces a regenerated electric field which is in a direction opposite to that of the radio frequency electric field and has a slight loss, so as to make up the influence of the non-uniformly distributed radio frequency electric field on the plasma density distribution. Finally, under the action of the resultant electric field formed by superposing the radio frequency electric field and the regenerated electric field, relatively even plasma density distribution at different positions in radial direction of the substrate 30 is obtained (referring to the curve "b" in FIG. 3), so as to improve the etching uniformity of the upper surface of the substrate 30.

Embodiment 3

Figure 5:
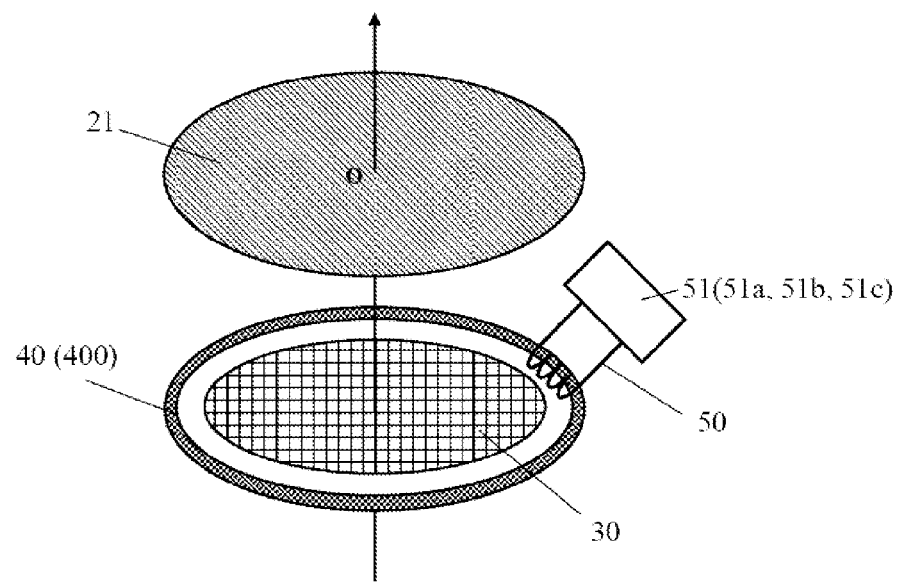
FIG. 5 is a schematic diagram of the plasma processing apparatus of the present invention, with an active coil and a regulating component being further arranged on the electric field regulating element.

FIG. 5 is a schematic diagram of the plasma processing apparatus of the present invention, with an active coil being further provided into the first or the second embodiment. As shown in FIG. 5, and referring to FIG. 2a and FIG. 3, the difference from the above embodiments is that at least one induction coil 50 is further provided in this embodiment, which is wound around at least a part of the electric field regulating element 40/400. The induction coil 50 can be further connected to an active element or a passive element (denoted by the block 51 in the Figure). For example, as one embodiment, the element 51a is a switching element. When the switching element 51a is closed, the induction coil 50 is shorted. A magnetic field is induced in the electric field regulating element 40/400 under the action of the above radio frequency electric field and a new induced current (not shown) on the induction coil 50 is in turn induced by the magnetic field. The new magnetic line generated by the inducted current is in a direction opposite to that of the original magnetic line in the electric field regulating element 40/400 and is nearly the same in magnitude. Hence, the effect of the electric field regulating element 40/400 can be adjusted. When the switching element 51a is open, there is no current generated in the induction coil 50, and therefore no influence will be caused on the effect of the electric field regulating element 40/400. Accordingly, by switching the switching element 51a off or on, the effect of the electric field regulating element 40/400 can be selectively controlled. The switching element 51a can be any mechanical or electric-controlled switch, such as a relay. The switching element 51a can be arranged outside the reaction chamber 10 or controlled by the computer software, so that the effect of the electric field regulating element 400 can be controlled from the outside of the reaction chamber 10 without opening the reaction chamber 10. This configuration can meet the requirement of different technology applications.

As another embodiment, the element 51b is an impedance element, for example, a pure resistor, capacitor or inductor or any combination thereof, which can generate a certain magnitude of resistance, inductive reactance or capacitive reactance, and can affect the magnitude of the induced current on the induction coil 50, so as to eventually adjust the strength of the regenerated electric field. The impedance value of the impedance element can be constant or adjustable. Preferably, the impedance element 51b is an adjustable element with smoothly adjustable magnitude of resistance, inductive reactance or capacitive reactance.

As yet another embodiment, the element 51c is an active element, for example a radio frequency source 51c (or RF3 shown in FIG. 4). By changing the parameter (for example power or frequency) of the radio frequency source 51c, an additional magnetic field is obtained in the electric field adjusting element 400, and the additional magnetic field is superposed onto the magnetic field generated by the radio frequency electric field passing through the electric field adjusting element 400, so as to regulate the strength of the regenerated electric field that is inducted. For example, the additional magnetic field is directed to be in the same direction with the original magnetic field, and the electric field strength of the regenerated electric field is increased, so as to make up the energy loss caused by the reluctance of the electric field adjusting element 400. Therefore, a better distribution curve is obtained as compared with the plasma density distribution curve shown by the curve "b" in FIG. 3, so that the uniformity of the plasma processing at the central portion and the edge portion of the substrate 30 is better.

Embodiment 4

Figure 6:
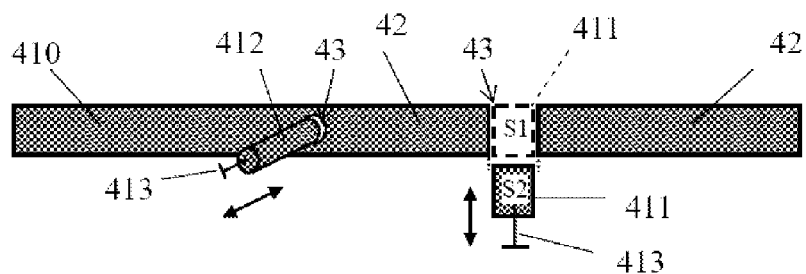
FIG. 6 is a partial schematic structural diagram of an electric field regulating element having a reluctance regulating means in the plasma processing apparatus of the present invention.

The embodiment shown in FIG. 6 is an improved structure based on the above embodiments, which can be arranged in the above plasma processing apparatus separately or together with the above embodiments.

Reference is made to FIG. 6, which is a schematic partial structural diagram of an electric field regulating element having a reluctance regulating means in the plasma processing apparatus of the present invention. The difference from the above several embodiments is that the electric field adjusting element 410 in this embodiment includes a main body 42 and a reluctance regulator 411 or 412, where the main body 42 cooperates with at least a part of the reluctance regulator 411 or 412, and the reluctance regulator 411 or 412 is position-adjustable relative to the main body 42. As a portion of the electric field adjusting element 410, the reluctance regulator 411 or 412 cooperates with the main body 42 to form a whole magnetic conductive electric field adjusting element 410, and under the action of the position regulating means 413, the reluctance regulator 411 or 412 is able to move along the axial direction or the radial direction of the electric field adjusting element 410, so as to form a corresponding gap 43 on the electric field adjusting element 410; because the reluctance at the gap 43 is different from that at other positions of the electric field adjusting element 410, the electric field strength of the regenerated electric field can be controlled by the reluctance of the part of the main body 42 connected with the reluctance regulator 411 or 412 to constitute the electric field adjusting element 410.

For example, the reluctance regulator 411 is moved along the axial direction (vertical direction) of the electric field adjusting element 410, and the position, at which the reluctance regulator 411 forms the electric field adjusting element 410 with the main body 42, is shown by the dashed line in FIG. 6. Under the action of the position regulating means 413 provided at the bottom of the reluctance regulator 411, the reluctance regulator 411 is able to move downward vertically from the position S1 continuously and be positioned at any time to regulate the size of the gap 43, until the reluctance regulator 411 is completely separated from the main body 42 (position S2). When the reluctance regulator 411 is at the position S2, because the main body 42 is disconnected due to the complete separation from the reluctance regulator 411, the reluctance is very large and the strength of the regenerated electric field that is inducted is too small to influence the radio frequency electric field generated by the second electrode. In this case, it can be considered that the regenerated electric field is not generated in the reaction chamber 10, and control of the plasma density distribution is achieved only by the radio frequency electric field, so as to meet the requirement of different etching processes. The reluctance regulator 411 is moved up and down between the two limit positions S1 and S2 to regulate the reluctance of the reluctance regulator 411 as needed.

Still for example, the reluctance regulator 412 is moved along the radial direction of the electric field regulating element 410, so that the reluctance regulator 412 is moved inward or outward along the radial direction of the electric field regulating element 410 to regulate the size of the gap 43. In the structure of this embodiment, the main body 42 is not completely disconnected, but is connected above and below the reluctance regulator 412 and forms a closed circuit. Therefore, even if the reluctance regulator 412 is separated from the main body 42 completely, the electric field regulating element 410 still has a basic reluctance matching with the reluctance of the closed circuit portion formed separately on the main body 42.

Embodiment 5

Figure 7:
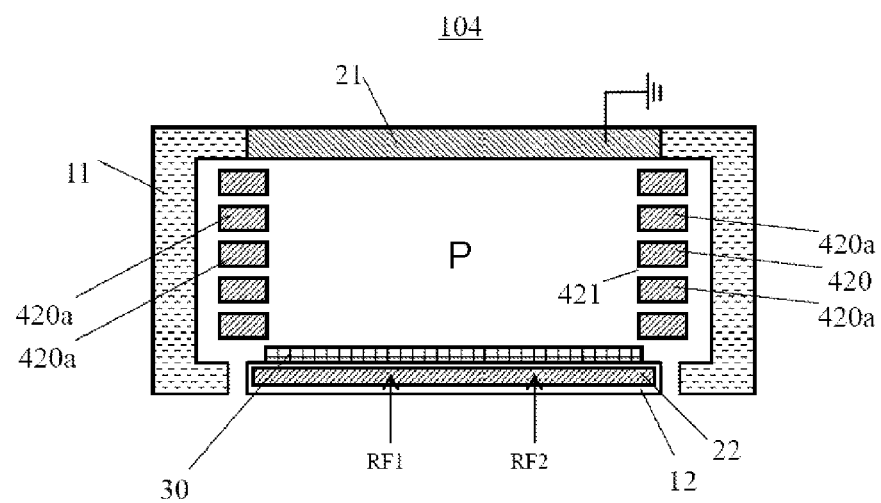
FIG. 7 is a schematic general structural diagram of yet another plasma processing apparatus provided by the present invention.

FIG. 7 is a schematic general structural diagram of yet another plasma processing apparatus provided by the present invention. The embodiment shown in FIG. 7 is an improved structure based on the above embodiments, which can be arranged separately or together with the above embodiments. The difference from the above several embodiments is that the reaction chamber 104 in this embodiment includes a plasma confinement assembly 420, which includes a plurality of (for example, at least two) rings 420a being stacked with one another and being separated from one another in the vertical direction. The plurality of rings 420a are provided to surround the region P between the first electrode 21 and the second electrode 22, in which the region P is generally the reaction region formed by the plasma for processing the substrate 30 or close to the region. Gaps 421 are present between the rings 420a, and when the plasma processing is performed on the substrate 30, the processed reaction gas is discharged from the reaction region P through the gaps 421, while the plasma is restrained in the reaction region P. The rings 420a are made of various anti-plasma etching materials, such as quartz. To utilize the creative design of the present invention at the same time, at least one or more of the rings 420a of the plasma confinement assembly 420 can be designed as the electric field regulating element of the above various embodiments.

According to the spirit and the essence of the present invention, in conjunction with the above drawings, the present invention further provides a method for processing the substrate 30 in a capacitive-coupled plasma processing apparatus. The plasma processing apparatus includes a reaction chamber 10 into which the reaction gas is introduced. In the reaction chamber 10, there is provided a supporting holder 12 for placing the substrate 30 to be processed, and a first electrode 21 and a second electrode 22 which are in parallel with each other. The first electrode 21 is provided in the top portion of the reaction chamber 10, and the second electrode 22 is provided inside the supporting holder 12. The method includes the following processes:

applying at least one radio frequency power supply to the first electrode 21 or the second electrode 22 for forming a radio frequency electric field in the reaction chamber 10;

regulating the radio frequency electric field 23 by at least one electric field regulating element 40 made of magnetic conductive material which is placed nearby the substrate 30 and has a hollow region 40b at the central portion of the electric field regulating element 40, where the radio frequency electric field 23 at least partially passes through the hollow region 40b of the electric field regulating element 40 so as to induce an alternating magnetic field according to Faraday's Law and to induce in turn a regenerated electric field 25 having a direction opposite to that of the radio frequency electric field 23, and the regenerated electric field 25 and the radio frequency electric field 23 are superposed to form a resultant electric field, which has a general equal distribution and strength in the central region and the edge region above the substrate 30 and by which the reaction gas are turned into plasma; and processing the substrate 30 using the plasma.

Optionally, the method further includes: further regulating the magnitude of the reluctance of the electric field regulating element 40, for changing the electric field strength of the regenerated electric field and thus regulating the resultant electric field.

Optionally, the method further includes: providing an induction coil 50 wound around at least a part of the electric field regulating element 40, and providing a switching element 51a connected to the induction coil 50, for changing the reluctance of the electric field regulating element 40 by switching the switching element 51a on or off Optionally, the method further includes: providing an induction coil 50 wound around at least a part of the electric field regulating element 40, and providing an adjustable impedance element 51b connected to the induction coil 50, for changing the reluctance of the electric field regulating element 40 by adjusting the impedance of the adjustable impedance element 51b. The impedance element 51b can be a pure resistor, capacitor, inductor or any combination thereof Optionally, the method further includes: providing an induction coil 50 wound around at least a part of the electric field regulating element 40, and providing a radio frequency source 51c connected to the induction coil 50, for obtaining an additional magnetic field in the electric field regulating element 40 by changing the power or the frequency of the radio frequency source 51c, and for adjusting the electric field strength of the regenerated electric field that is inducted by superposing the additional magnetic field and the magnetic field generated by radio frequency electric field passing through the electric field regulating element 40.

Optionally, the electric field regulating element 40 is provided in the inner space of the reaction chamber 10 and is placed on a supporting element (not shown), and the method further includes adjusting the position of the supporting element, so as to adjust the position of the electric field regulating element 40 relative to the substrate 30.

Preferably, the electric field regulating element 40 is made of ferrite material.

Optionally, the electric field regulating element 40 includes a main body 42 and a reluctance regulator 411 or 412, where the main body 42 cooperates with at least a part of the reluctance regulator 411 or 412, and the reluctance regulator 411 or 412 is position-adjustable relative to the main body 42. The method further includes adjusting the position of the reluctance regulator 411 or 412 relative to the main body 42.

It should be understood that besides being mounted at various positions in the above embodiments, the electric field regulating element described in the above embodiments and methods can also be located nearby the outer edge of the first electrode 21 or located at any position in the horizontal space between the first electrode 21 and the second electrode 22. The horizontal space refers to the region surrounded by the plane determined by a surface of the first electrode 21 and the plane determined by a surface of the second electrode 22, and thus the horizontal space is not limited to the vertical space being surrounded only by the second electrode, but includes the periphery extending portion of the vertical space as well.

The electric field regulating element can be provided in parallel with the substrate to be processed, and can also form an angle with the substrate.

The electric field regulating element can be provided at various suitable positions according to the practical requirement and the product design. For example, the electric field regulating element can be provided on the sidewall of the reaction chamber, can be provided on a certain component in the reaction chamber, and can also be placed on a supporting element (not shown) that is additionally provided, with the position of the supporting element being fixed or adjustable. By adjusting the horizontal position or the vertical height of the supporting element, the position of the electric field regulating element can be further adjusted. Preferably, the electric field regulating element can be provided on a horizontal-height adjustable supporting bar. In the case that the function of the electric field regulating element is not needed, the vertical height of the electric field regulating element can be adjusted to be placed at the bottom or top portion of the reaction chamber as being "hided" while not to affect the distribution and the discharge of the reaction gas. And in the case that the function of the electric field regulating element is needed, the electric field regulating element is moved out. Preferably, an annular electric field regulating element made of magnetic conductive material (for example ferrite) can be provided around the center of the substrate and located in upper portion of the reaction chamber. The annular electric field regulating element can move up and down under the driving of a mechanical structure, for influencing the distribution of the radio frequency electric field at different positions, and the desired electric field distribution and plasma density distribution can be easily obtained by adjusting the position. A plurality of annular electric field regulating elements can even be provided at different heights to obtain the best plasma distribution.

The electric field regulating element can be designed in various shapes as practical needed, such as in a tube-shaped structure on which several air vents are provided.

In a word, according to the plasma processing apparatus and the method of the present invention, by providing an electric field regulating element 40 made of magnetic conductive material such as ferrite ring at the periphery of the substrate 30, a regenerated electric field 25 in a direction opposite to that of the original radio frequency electric field 23 is induced in the reaction chamber 10 to decrease the influence of the non-uniform distribution of the original radio frequency electric field 23 at the central portion and the edge portion of the substrate 30. In the present invention, under the effect of the resultant electric field of the radio frequency electric field 23 and the regenerated electric field 25, the plasma density is distributed uniformly at the central portion and the edge portion of the substrate 30, so that the processing (such as etching or depositing) performed with the plasma on the substrate 30 is more uniform.

Further, according to the plasma processing apparatus and the method for processing the substrate of the same provided by the present invention, by providing an "electric field lens" or an electric field regulating element made of magnetic conductive material such as ferrite ring at the periphery of the substrate, a regenerated electric field in a direction opposite to that of the original radio frequency electric field is induced in the reaction chamber, for generating a reverse feedback of the electric field strength, and decreasing the equivalent quality factor Q value of the reaction chamber, thus the frequency band width of the reaction chamber is widen, the operation of the reaction chamber system is stabilized, and so that the reaction chamber can be used in radio frequency domain with a wide range.

With the plasma reaction chamber of the present invention having decreased Q value, the disadvantageous high-voltage arcing which is easily generated in the prior art reaction chamber having high Q value can be effectively eliminated.

Although the present invention has been describe in details through the above preferred embodiments, it should be realized that the above description should not be considered as limit to the present invention. Various modifications and alternatives of the present invention will be obvious to those skilled in the art in view of the above contents.

Therefore the scope of protection of the present invention should be defined by the following claims.

What is claimed is:

1. A capacitive-coupled plasma processing apparatus, comprising:
   a reaction chamber into which reaction gas is introduced, wherein a supporting holder for placing a substrate to be processed, a first electrode and a second electrode are arranged in the reaction chamber, the first electrode and the second electrode are arranged in parallel, the second electrode is arranged inside the supporting holder, and at least one radio frequency power source is connected to the first electrode or the second electrode to form a radio frequency electric field in the reaction chamber for generating plasma of the reaction gas; and
   at least one electric field regulating element made of magnetic conductive material, which is arranged nearby the substrate and has a hollow region in the central portion of the electric field regulating element, wherein the electric field regulating element has a regenerated electric field having a direction opposite to that of the radio frequency electric field in a case that the radio frequency electric field at least partially passes through the hollow region of the electric field regulating element, and in the reaction chamber the regenerated electric field and the radio frequency electric field are superposed to form a resultant electric field, wherein the electric field regulating element comprises a main body and a reluctance regulator position-adjustable relative to the main body, the reluctance regulator is movable along axial or radial direction of the electric field adjusting element and forms a gap on the electric field adjusting element, and a field strength of the regenerated electric field is controllable by a size of the gap.

2. The plasma processing apparatus according to claim 1, wherein the electric field regulating element is a ferrite ring.

3. The plasma processing apparatus according to claim 1, wherein the electric field regulating element is partially arranged in the reaction chamber and is partially located at a position in a horizontal space between the first electrode and the second electrode.

4. The plasma processing apparatus according to claim 1, wherein the electric field regulating element is arranged partially inside a sidewall of the reaction chamber.

5. The plasma processing apparatus according to claim 1, wherein the electric field regulating element is arranged in parallel with the substrate to be processed.

6. The plasma processing apparatus according to claim 1, wherein the electric field regulating element comprises an inner surface, a region inside the inner surface constituting the hollow region, and the hollow region has a shape corresponding to that of the substrate to be processed.

7. The plasma processing apparatus according to claim 6, wherein the hollow region and the substrate to be processed are both in a circular shape, and the hollow region has a diameter equal to, larger or smaller than that of the substrate to be processed.

8. The plasma processing apparatus according to claim 1, further comprising an induction coil wound around at least a part of the electric field regulating element.

9. The plasma processing apparatus according to claim 8, wherein the induction coil is further connected to a switching element or an impedance element.

10. The plasma processing apparatus according to claim 9, wherein the induction coil is further connected to a radio frequency source.

11. The plasma processing apparatus according to claim 8, wherein the induction coil is further connected to an impedance-adjustable impedance element.

12. The plasma processing apparatus according to claim 1, wherein the electric field regulating element is arranged on a position-fixed or position-adjustable supporting element.

13. The plasma processing apparatus according to claim 1, wherein a plasma confinement assembly comprising a plurality of rings is arranged in the reaction chamber, the plurality of rings are stacked and separated from one another in the vertical direction and are arranged to surround a region between the first electrode and the second electrode, and at least one of the rings of the plasma confinement assembly is the electric field regulating element.

14. A method for processing a substrate in a capacitive-coupled plasma processing apparatus, wherein the plasma processing apparatus comprises a reaction chamber into which reaction gas is introduced, a supporting holder for placing a substrate to be processed, a first electrode and a second electrode are arranged in the reaction chamber, the first electrode and the second electrode are arranged in parallel, the first electrode is arranged in a top portion of the reaction chamber, the second electrode is arranged inside the supporting holder, and the method comprises:
   applying at least one radio frequency power supply to the first electrode or the second electrode for forming a radio frequency electric field in the reaction chamber;
   adjusting the radio frequency electric field by at least one electric field regulating element made of magnetic conductive material which is placed nearby the substrate and has a hollow region at the central portion of the electric field regulating element, wherein the radio frequency electric field at least partially passes through the hollow region of the electric field regulating element so as to induce a regenerated electric field having a direction opposite to that of the radio frequency electric field, and the regenerated electric field and the radio frequency electric field are superposed to form a resultant electric field by which the reaction gas are turned into plasma, wherein the electric field regulating element comprises a main body and a reluctance regulator position-adjustable relative to the main body, the reluctance regulator is movable along axial or radial direction of the electric field adjusting element and forms a gap on the electric field adjusting element, and adjusting the radio frequency electric field comprises adjusting a field strength of the regenerated electric field by adjusting a size of the gap; and processing the substrate with the plasma.

15. The method according to claim 14, further comprising regulating a reluctance of the electric field regulating element for changing a strength of the regenerated electric field.

16. The method according to claim 14, wherein the electric field regulating element comprises a main body and a reluctance regulator, the main body cooperates with at least a part of the reluctance regulator, and the reluctance regulator is position-adjustable relative to the main body.

17. The method according to claim 14, further comprising providing an induction coil wound around at least a part of the electric field regulating element, and providing a switching element connected to the induction coil for adjusting the function of the electric field regulating element by switching the switching element on or off.

18. The method according to claim 14, further comprising providing an induction coil wound around at least a part of the electric field regulating element, and providing an adjustable impedance element connected to the induction coil for changing a reluctance in the electric field regulating element by adjusting an impedance of the impedance element, so as to control a strength of the regenerated electric field.

19. The method according to claim 14, further comprising providing an induction coil wound around at least a part of the electric field regulating element, and providing a radio frequency source connected to the induction coil for adjusting strength of the regenerated electric field by changing parameters of the radio frequency source.

* * * * *